United States Patent [19]

Johnson et al.

[11] Patent Number: 4,679,118
[45] Date of Patent: Jul. 7, 1987

[54] ELECTRONIC CHIP-CARRIER HEAT SINKS

[75] Inventors: Philip A. Johnson, Exeter; Alfred F. McCarthy, Belmount, both of N.H.

[73] Assignee: Aavid Engineering, Inc., Laconia, N.H.

[21] Appl. No.: 890,890

[22] Filed: Jul. 28, 1986

Related U.S. Application Data

[63] Continuation of Ser. No. 638,415, Aug. 7, 1984, abandoned.

[51] Int. Cl.⁴ .............................................. H05K 7/20
[52] U.S. Cl. ................................ 361/386; 174/16 HS; 439/487
[58] Field of Search .................. 165/80 B; 174/16 HS, 174/52 FP; 357/81; 361/383, 386–388; 339/112 R, 17 C, 17 CF

[56] References Cited

U.S. PATENT DOCUMENTS

| | | | |
|---|---|---|---|
| 3,495,131 | 2/1970 | Melcher | 361/386 |
| 3,670,215 | 6/1972 | Wilkens | 174/16 HS |
| 3,904,262 | 9/1975 | Cutchaw | 174/16 HS |
| 4,235,285 | 11/1980 | Johnson | 174/16 HS |

FOREIGN PATENT DOCUMENTS 2425723  12/1975  Fed. Rep. of Germany ... 174/16 HS

OTHER PUBLICATIONS

IBM Tech. Discl. Bull., vol. 10, No. 8, Jan. 1968, p. 1242, "Snap-On Heat Exchanger", Milligan.

Primary Examiner—G. P. Tolin
Attorney, Agent, or Firm—James E. Mrose

[57] ABSTRACT

Dissipation of heat from a socketed leadless electronic chip-carrier package is promoted by a heat-conducting metal socket cap distinctively overlying and guiding heat away from the socketed package fully along a broad planar surface area, the socket cap being of a unitary construction which both mechanically holds the package securely mated with a multi-pin socket and also cools the package by way of an integrated array of heat-radiating elements; edge clasping of the cap with a chip-carrying socket avoids interference with needed conduction of heat away from central areas of the package and cap.

6 Claims, 5 Drawing Figures

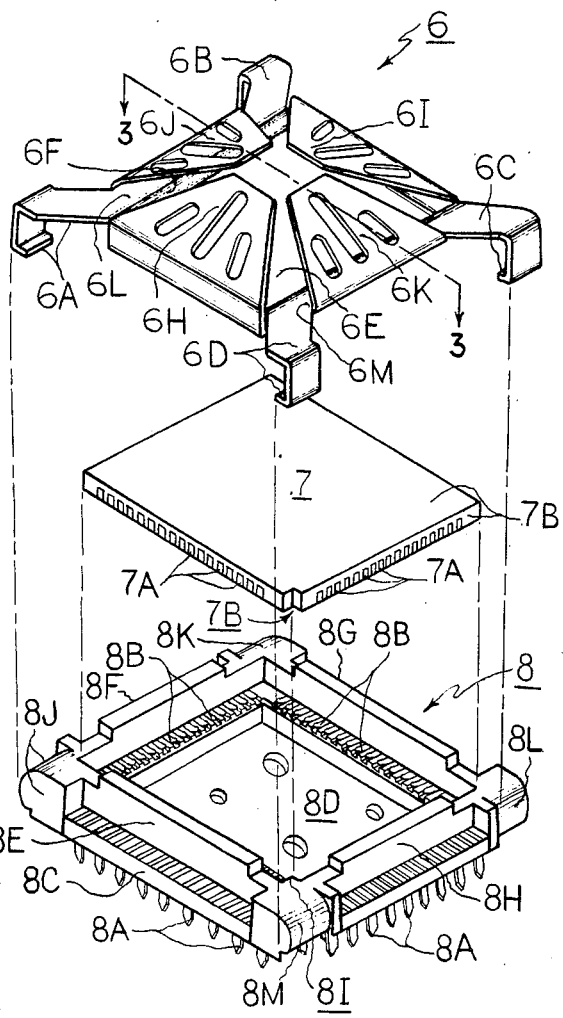
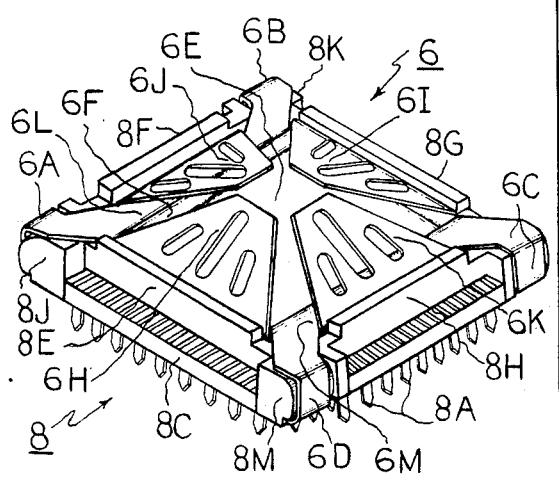
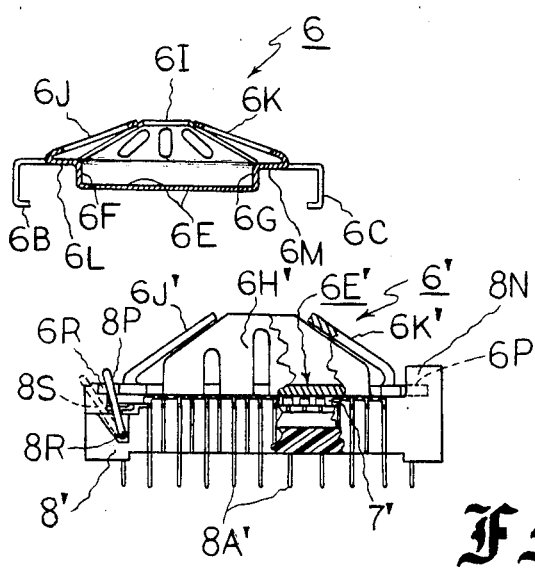
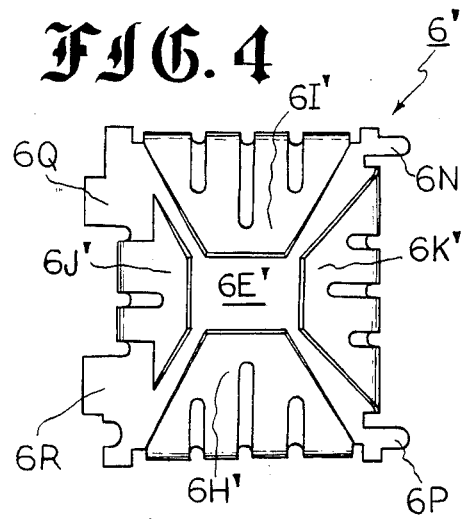
FIG. 1
FIG. 2
FIG. 3
FIG. 4
FIG. 5

ELECTRONIC CHIP-CARRIER HEAT SINKS

This is a continuation of co-pending application Ser. No. 638,415 filed on Aug. 7, 1984, now abandoned.

BACKGROUND OF THE INVENTION

The present invention relates to improvements in dissipation of heat from socketed electronic chip carriers and the like, and, in one particular aspect, to novel and advantageous integrally-composite heat sinks and covers, for miniature socketed leadless chip carriers, which lend themselves to low-cost fabrication from sheet metal and which are constructed and disposed to make intimate broad-area heat-transfer engagements with a chip carrier and to convectively discharge heat efficiently, without making intricate socketing procedures more difficult and without imposing troublesome bulk.

Semiconductor devices, microcircuit modules and integrated circuits tend to be highly susceptible to damage from heat generated internally as efforts are made to extend their operations into higher and higher ranges of power. One common and economical expedient for expelling and forestalling the build-up of heat in such electronic items involves the attachment of small finned metal extrusions or stampings which serve to conduct heat away from their thermally-vulnerable regions and, in turn, to dissipate it by way of convective coupling with the ambient atmosphere. In some instances the items to be cooled are provided with exposed metal tabs or plates by which sheet-metal heat sinks may withdraw heat efficiently from protectively-encapsulating bodies within which the semiconductors are located (as illustrated in U.S. Pat. Nos. 3,670,215 and 4,041,524), and, in other cases, multi-pin packages of integrated circuitry are straddled by clip-on heat sinks which clasp directly against the plastic packages themselves (illustrated in U.S. Pat. Nos. 4,222,090 and 4,408,220). It has also been known to fabricate an integrated-circuitry module such that it incorporates as one original structural component a permanently-encasing metal cover shaped to promote release of heat from the circuitry within (U.S. Pat. No. 4,092,697), and radiator elements have also been glued directly onto small electronics packages to promote cooling.

The ease and convenience with which heat-sink attachments may be fitted onto packages, and the extent to which efficient heat transfer is promoted along the pathways between those attachments and the packages they serve, are highly important considerations. For example, the need to stock and handle numerous parts or to have resort to special tools and fasteners, are complications which manufacturers generally seek to avoid, for the obvious reasons, and it must also be assured that when assembly of a delicate package with its heat sink has been completed there will be intimately-connected broad-area and low-loss conductive pathways through which unwanted heat will be expelled. Such problems become intensified as the electronics packages become ever smaller, more intricate, and expensive, as in the case of modern substantially-monolithic leadless chip carrier (LCC) packages involving large scale integrated circuitry on substrates whose numerous electrical connections are in the form of tab-like contacts arrayed in rows along peripheral edges of thin square molded carriers. Those leadless chip carriers are designed for mounting within sockets which orient and hold them in secure engagements with numerous socket contacts which couple the various chip-carrier contacts with socket pins, the latter pins being the leads by which needed electrical circuit connections are completed through wiring of a printed-circuit-board to which the socket is soldered. The very small multi-pinned carrier sockets are structurally somewhat frail, and they are especially prone to injury when their carriers are being inserted or removed; accordingly, radiator-type heat-sink attachments used to protect or enhance performance of the chip circuitry can be expected to be correspondingly small and troublesome to assemble securely and without interfering with the socketing and possibly damaging the socket and carrier. In practice of the present teachings, such difficulties may be averted by way of special dual-function heat sinks which are uniquely arranged as integral portions of removable covers used to retain carriers within their sockets, each sink-cover unit not only being of low-cost construction and being conveniently dealt with as a single part but also offering the advantage that it tends to physically orient itself reliably for an essentially optimum heat-transfer relationship with a thermally-vulnerable carrier.

SUMMARY OF THE INVENTION

The present invention is aimed at improving means for dissipating heat from leadless chip carriers, and particularly in respect of their promotion of efficient heat-transfers and the economies of their manufacture and the ease, convenience and reliabilty associated with their installation and use. In one preferred embodiment, a thermally-conductive sheet-metal cover or cap, which latches atop a small multi-pin socket to press a square leadless chip carrier securely against minute contacts within a shallow accommodating recess, is fashioned as a heat sink having both a central broad-area planar square base of essentially the same size and outline as the exposed top of the socketed carrier and a set of four heat-radiating plates integral with the base along its edges, all of the heat-radiating plates being bent upwardly and inwardly in a generally-pyramidal open array. Provisions for latching the composite cap and heat sink unit onto the socket are framed laterally around the central heat-sink portions, and may allow for hinged or snap-fit or slide-lock assembly of the unit with the socket in a predetermined orientation which insures that, when the socket is closed, the underside of the base of the unit will make a substantially voidless broad-area engagement with the top of an underlying carrier. The latter conditions are optimum for efficient heat-exchange, and may in some instances be improved by way of a thin compressible pad of heat-conducting material interposed between the mating surfaces. Conductive heat flow from the top of a carrier is first upwardly into the overlying broad-area base of the composite cap and heat-sink unit and then laterally outward to the heat-radiating plates along the edges, whence major convective thermal releases occur; there is no preferential directionality of the lateral conductive heat flow across the base, and that is a commonly favored condition in respect of good cooling of leadless chip carriers. Very beneficially, firm and even compressive forces essential to good electrical contacting between a leadless carrier and a multiplicity of contacts in its socket are developed as the base of the unit is pressed against the carrier by action of the latching provisions.

Accordingly, it is one of the objects of the present invention to provide novel and improved heat-dissipation arrangements, for miniature socketed leadless electronic chip carriers and the like, in which both socket-covering and heat-sink functions are advantageously served by small composite metal units having broad flat central heat-conducting areas connected to heat-radiating elements and further having peripherally-disposed provisions for latching such units onto sockets and for applying important compressive forces evenly across carriers socketed within them.

A further object is to provide unique and advantageous miniature heat sinks of low-cost sheet-metal construction which lend themselves to uncomplicated and non-interfering installation and use with socketed leadless chip carriers and which, as integral parts of socket covers, apply well-distributed forces which promote both good electrical contacting and firm engagements for conductive heat-transfer.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

FIG. 1 is an "exploded" pictorial representation of an improved heat-sink and socket-cover unit and its associated leadless chip carrier and socket;

FIG. 2 portrays the items in FIG. 1 in a closed fully-mated relationship;

FIG. 3 is a cross-sectioned side view of the heat-sink and socket-cover unit shown in FIGS. 1 and 2, the section being taken at the site 3—3 in FIG. 1;

FIG. 4 provides a plan view of another construction of composite heat-sink and socket-cover unit, intended for use with a modified form of socket; and FIG. 5 presents a partly cross-sectioned side view of the unit of FIG. 4 latched onto a leadless chip-carrier socket.

DETAILED DESCRIPTION OF THE PREFERRED EMBODIMENTS

Having reference to the drawings, wherein like reference characters designate identical or corresponding parts throughout the different views, and more particularly to FIG. 1 thereof, one embodiment of an improved electronic chip-carrier heat sink, 6, is shown in an "exploded" relationship with a leadless chip carrier 7 and a multi-pin socket 8 with which the carrier is designed to mate for purposes of effecting numerous electrical connections with intricate microcircuitry of the carrier. Carrier 7 is of a generally conventional type, involving a thin and flat substantially square rectangular-parallelepiped body of essentially monolithic construction which is sometimes referred to in the industry as a JEDEC large scale integrated circuit package, there being one or more semiconductor networks within it coupled appropriately with a multiplicity of electrical contact pads or tabs 7A distributed around all four peripheral edges and nearby underside edges of its plastic body 7B. Commonly, such carriers are intended to interact with other networks and components on printed circuit boards, and for those purposes, soldered connections must be made with related circuit-board wiring; socket 8 allows for those connections to be effected by way of its depending rows of conductive tinned pins 8A, each of which will penetrate a different hole in a circuit board (not shown) and will become united with printed wiring there during wave-soldering from below. Within the socket, the illustrated outer socket pins 8A are individually connected to the carrier contacts 7A by way of their small inner contacts 8B, each of the latter contacts being in the form of a tiny upwardly-curved cantilevered strip of springy material, preferably integral with an appropriate and proximate outer socket pin. Plastic body 8C of the socket includes a base 8D and frame elements 8E–8H which hold the outer pins and which orient their inner contacts 8B peripherally about a shallow recess, bordered by the frame elements, designed as a receptacle for the square parallelepiped carrier 7. Diminutive contacts 7A are L-shaped, with their lower legs extending inwardly along bottom edges of the carrier for a short distance (not visible in the drawings), and the socket contacts 8B will therefore engage and make electrical connection with them from beneath when the carrier is socketed in the receptacle defined by frame elements 8E–8H. A notch 7B in the carrier is intended for alignment with a corresponding projection 8I in the socket, insuring that the wrong connections will not be made by inadvertently inserting the carrier with an improper orientation.

Both to prevent such a carrier from becoming accidentally dislodged from its socket and to force it downwardly with all its edge contacts 7A in firm engagement with all of the springy inner contacts 8B, the assembly of carrier and socket has in the past been provided with a partial cover having some of the features of cover 6. Specifically, such prior covers have included an open-centered framework of resilient sheet metal having integral corner clips such as 6A–6D, the latter being proportioned to flex around and catch with lower edges of suitably-rounded corners 8J–8M of the socket in the manner represented in FIGS. 1 and 2. Such an open-centered framework would bear down against the socketed carrier only near its periphery, and only at small localized positions. With such a framework intentionally left widely open in the middle, a separate finned heat-sink member could then be affixed that part of the top of the socketed carrier which remained exposed through the opening, as by gluing the heat sink to the carrier there. However, the heat sink in such an arrangement constitutes an impediment in respect of insertion and removal of a carrier, and it is a separate item whose stocking and processing and assembly add manufacturing complications and expense, and gluing not only can introduce highly undesirable strains due to expansion-coefficient problems but can also set up a barrier to free flow of heat. Further, any shock to or vibration of such a heat sink can jeopardize the integrity of the sensitive carrier. Even if gluing is avoided by clamping a heat sink between the carrier and the framework, the other difficulties are not resolved, and one must then make special allowance for added thickness and contend with unevenness of pressure which would in turn allow for poor and uneven contact and heat-transfer between carrier and heat sink. Instead, in accordance with the present teachings, the entire central portion of the clip-on cover arrangement 6 is made to have broad-area heat-sinking and pressure-applying and protective functions, there being no separate heat sink member to deal with, and no adhesion or clamping of a heat sink to a carrier, and the composite cover serving advantageously to isolate the carrier from mechanical impacts or the like by shunting forces from the heat-sinking protrusions over to the socket body.

In the improved clip-on composite of cover and heat-sink, 6, the four clip portions 6A–6D are integral with a substantially square central base 6E, at its corners. Because the cover must reach down over the socket frame to engage the top of the socketed carrier in the particular construction under discussions, base 6E is held at a slightly lower level than top surfaces of the clips, and, for that purpose, the sheet metal of which the composite is fabricated is bent to exhibit appropriate sides 6F and 6G at two opposite positions (FIG. 3). Otherwise, base 6E is substantially planar and unbroken across a square area essentially the same as that of the top surface of carrier 7, so that it will make intimate heat-collecting contact with that surface over as broad an expanse as possible. Heat to be dissipated is conductively transferred upwardly from the carrier into the base 6E and then advantageously flows laterally outwardly without significant preferential directionality. Along two opposite edges, the heat is then conducted upwardly into two perforated radiator plates, 6H and 6I, which are integral with the base and are folded over it and inclined in opposite directions inwardly toward one another. Two further and similar inwardly-inclined perforated plates 6J and 6K are integral with the remaining two edges of base 6E, via the upstanding sides 6F and 6G and also by way of framework portions 6L and 6M to which the opposite pairs of clips are joined. Convective dissipation of excess heat occurs through the inclined plates, their perforations in the shape of elongated slots promoting good thermal matching with an ambient atmosphere and allowing currents of its gases to circulate freely for efficient heat transfer. For the latter purposes also, the generally pyramidal configuration developed by the inclined radiator plates is truncated, leaving a generous central opening to promote circulation; the radiator plates are each therefore of truncated triangular outline. That pyramidal arrangement is favorable in respect of employing good amounts of heat-exchanging metal while keeping the overall height low enough to avoid mechanical interference with other things nearby; its outline is also desirably regular, without projections likely to catch or entangle.

Composite cover and heat-sink 6 readily snaps onto the socket 8 to make a compact and highly effective heat-dissipating assemblage. The carrier may be inserted and then capped after the socket has been soldered to a circuit board, thereby avoiding related risks during that stage of processing, and, afterward, the carrier may be removed and replaced by first simply prying the clips from the socket corners to which they are caught and later snapping them back into place once a carrier has been newly inserted. No manipulation and fitting or gluing of a separate heat sink is involved, and risk of injury to the carrier is lessened. The sheet metal of which unit 6 is fashioned should exhibit outstanding thermal conductivity for its heat-sinking purposes, and copper- and aluminum-based materials are used, rather than the poorly-conducting stainless steel which appears in certain prior clips. Some resilience is also required, for the clips to act properly and for the broad-area base 6E to have a highly desirable self-adjusting propensity by which it will take up full firm engagement with the top of a carrier so as to extract about the maximum of heat which it is capable of withdrawing; generally, the aforesaid materials and proportions generally like those shown will afford adequate yielding and flexing.

In another construction which effects comparable improved results, shown in FIGS. 4 and 5, the composite heat-sink and cover unit 6' need not itself be resilient, and relatively thick and soft aluminum with good thermal conductivity may therefore be used to advantage. As in the previously-described embodiment, there is a planar broad-area base 6E' intended for engagement with the top of a socketed carrier 7' (FIG. 5), and there is a truncated pyramidal array of four slotted radiator plates 6H'–6K', The central base 6E' has a configuration and an uninterrupted area which are a close match for the top of carrier 7', so that heat may be taken up from it efficiently, and the radiator plates are turned up directly from the four edges of that base. Projecting slightly beyond the central base, peripherally, at its corners and in the same plane, are a first pair of tongue-shaped catches 6N and 6P extending in the same lateral direction relative to one edge of the base, and a second pair of coplanar catches 6Q and 6R extending in the opposite direction relative to an opposite edge of the base. The two sets of catches cooperate with the socket to allow the unit 6' to be affixed and removed easily, and to provide for its tight locking in place over a carrier. The tongue-shaped pair of catches are designed to slide into and be held in complementary-shaped recesses in upstanding posts along one peripheral edge of the plastic socket; a dashed-linework showing of one such catch, 6P, in socket post 8N, appears in FIG. 5. Along the opposite edge of the socket, a spring-wire bail 8P is pivoted about an axis 8R and is angularly movable from an "open" position, shown by dashed linework 8S, to the illustrated full-line "closed" position (FIG. 5) where it overlies and holds down the catches 6Q and 6R. Sockets generally like 8', and slide-on covers which may be caught and held on them in the manner described, are known commercial items, but not with our improved heat-sinking. One of the radiator plates, 6J', is not as broad as the others, because material available for its fabrication at its edge of the base is reduced by the need to form catches 6Q and 6R there as well; however, the heat-dissipation actions are not seriously unbalanced. Socket pins 8A' make numerous spring-finger contacts with the underside of a carrier 7', and, as in the case of the embodiment of FIGS. 1–3, and the carrier therefore tends to be yieldably raised; accordingly, unit 6' requires no resiliency of its own to insure that it will press the carrier downwardly against the underlying contacts and will be kept in even and broad-area heat-transfer engagement with the top of the carrier.

Although the illustrated pyramidal arrangement of radiator plates is currently preferred, it is of course feasible to fashion the turned-up heat-radiating edges differently, in the form of bristling arrays of fins, for example. And, as has already been seen, the peripheral provisions for catching and releasably holding the improved composite heat-sink and cover unit may involve a variety of structures, some resilient and/or slidable, others not. Heat dissipations may also be promoted by ribbed extrusions or the like, or by cast items, where resiliency is not required, or where resilient clip or catch provisions are integrally united with them and there are no significant voids left to impede flow of heat away from a carrier.

It should therefore be understood that the specific practices and embodiments described and shown herein have been presented by way of disclosure, rather than limitation, and that various modifications, combinations and substitutions may be effected by those skilled in the art without departure in spirit or scope from this invention in its broader aspects and as set forth in the appended claims.

What we claim as new and desire to secure by Letters Patent of the United States is:

1. An electronic chip-carrier mounting and heat sink, comprising a socket of insulating material having an outwardly-projecting array of electrical leads disposed for connection with circuit-board wiring and an inner array of electrical contacts framing an upwardly-opened recess in said socket and disposed to engage edge contacts of a leadless chip carrier which may be nested therein and thereby couple such edge contacts with said leads, and a single-piece composite heat-sink and cover means stamped from sheet metal having good thermal conductivity and adapted for dissipation of heat from such a carrier which may be nested in said recess and for movements between a closed position in which it presses against and closes over such a carrier and an open position in which it releases such a carrier from said socket, said composite heat-sink and cover means including a relatively broad-area central heat-sink portion having a substantially planar and uninterrupted lower heat-transfer surface disposed to press against a surface of the same size and shape as the top of such a carrier nested in said recess and further having stamped sheet-metal heat-radiating members integral therewith along edges thereof bent to extend upwardly away from said surface and from the top of such a carrier, said heat-transfer surface of said central portion conducting heat from such a carrier laterally to said heat-radiating members along said edges thereof and said heat-radiating members in turn convectively releasing the heat to an ambient atmosphere, and said composite heat-sink and cover means including fastener means disposed laterally beyond the periphery of said central heat-sink portion, said fastener means selectably cooperating with fastener provisions on said socket in allowing said composite heat-sink and cover means to move between the said open and closed positions and in releasably holding it closed over such a carrier.

2. An electronic chip-carrier mounting and heat sink as set forth in claim 1 wherein said recess in said socket is shallow and of substantially rectangular-parallelepiped form adapted to receive therein a carrier which is also of substantially said form, wherein said heat-transfer surface of said central heat-sink portion is correspondingly rectangular, and wherein said heat-radiating members extend upwardly from along all four edges of said central heat-sink portion.

3. An electronic chip-carrier mounting and heat sink as set forth in claim 2 wherein said heat-radiating members are bent to incline over the top of said central heat-sink portion in spaced relation thereto.

4. An electronic chip-carrier mounting and heat sink as set forth in claim 3 wherein said heat-radiating members are plates each of which at its lower end is about the width of the edge of said heat-sink portion from along which it is bent.

5. An electronic chip-carrier mounting and heat sink as set forth in claim 4 wherein each of said plates is perforated to promote circulation of ambient atmosphere through spaces between it and said top of said heat-sink portion.

6. An electronic chip-carrier mounting and heat sink as set forth in claim 2 wherein said fastener means comprises clip members which are flexible and which snap onto and catch releasably with said fastener provisions on said socket, said clip members being disposed near corners of said central heat-sink portion and being of said sheet metal and integral with said single-piece composite heat-sink and cover means.

* * * * *